US010763125B2

(12) United States Patent
He et al.

(10) Patent No.: US 10,763,125 B2
(45) Date of Patent: Sep. 1, 2020

(54) SEMICONDUCTOR DEVICE HAVING ONE OR MORE TITANIUM INTERLAYERS AND METHOD OF MAKING THE SAME

(71) Applicant: Alpha and Omega Semiconductor (Cayman), Ltd., Grand Cayman (KY)

(72) Inventors: Wei He, Hillsboro, OR (US); Chris Wiebe, Hillsboro, OR (US); Hongyong Xue, Hillsboro, CA (US)

(73) Assignee: ALPHA AND OMEGA SEMICONDUCTOR (CAYMAN), LTD., Grand Cayman (KY)

( * ) Notice: Subject to any disclaimer, the term of this patent is extended or adjusted under 35 U.S.C. 154(b) by 0 days.

(21) Appl. No.: 16/555,840

(22) Filed: Aug. 29, 2019

(65) Prior Publication Data

US 2019/0385863 A1    Dec. 19, 2019

Related U.S. Application Data

(62) Division of application No. 15/811,417, filed on Nov. 13, 2017, now Pat. No. 10,438,813.

(51) Int. Cl.
*H01L 21/3213* (2006.01)
*H01L 21/768* (2006.01)
*H01L 23/532* (2006.01)
*H01L 23/00* (2006.01)

(52) U.S. Cl.
CPC .. *H01L 21/32134* (2013.01); *H01L 21/76838* (2013.01); *H01L 21/76849* (2013.01); *H01L 23/53214* (2013.01); *H01L 23/53223* (2013.01); *H01L 23/53266* (2013.01); *H01L 23/562* (2013.01)

(58) Field of Classification Search
CPC .................... H01L 23/53266; H01L 23/53214
See application file for complete search history.

(56) References Cited

U.S. PATENT DOCUMENTS

2004/0259374 A1* 12/2004 Yasuda ............. H01L 21/76802
                                                438/751
2011/0068398 A1*  3/2011 Anderson ........... H01L 21/2255
                                                257/347
2015/0364587 A1* 12/2015 Yoshinaga ......... H01L 29/7397
                                                257/144

* cited by examiner

Primary Examiner — Jay C Chang
Assistant Examiner — Mikka Liu
(74) Attorney, Agent, or Firm — Chen-Chi Lin

(57) ABSTRACT

A semiconductor device comprising a substrate layer, an epitaxial layer, a dielectric layer, a first aluminum layer, a first titanium interlayer and a second aluminum layer. The first titanium interlayer is disposed between the first aluminum layer and the second aluminum layer. A process for fabricating a semiconductor device comprising the steps of: preparing a semiconductor wafer; depositing a first aluminum layer onto the semiconductor wafer; depositing a first titanium interlayer onto the first aluminum layer; depositing a second aluminum layer onto the first titanium interlayer; applying an etching process so that a plurality of trenches are formed so as to expose a plurality of top surfaces of a dielectric layer; and applying a singulation process so as to form a plurality of separated semiconductor devices.

13 Claims, 11 Drawing Sheets

SEMICONDUCTOR DEVICE HAVING ONE OR MORE TITANIUM INTERLAYERS AND METHOD OF MAKING THE SAME

CROSS-REFERENCE TO RELATED APPLICATIONS

This Patent Application is a Divisional Application of a pending application Ser. No. 15/811,417 filed on Nov. 13, 2017. The Disclosure made in the patent application Ser. No. 15/811,417 is hereby incorporated by reference.

FIELD OF THE INVENTION

This invention relates generally to a semiconductor device having one or more titanium interlayers and a method of making the semiconductor device. More particularly, the present invention relates to one or more titanium interlayers having a pre-determined thickness.

BACKGROUND OF THE INVENTION

Scanning electron microscope (SEM) images of a semiconductor device show that lateral extrusion including whiskers and hillocks of an aluminum layer significantly increases when a thickness of the aluminum layer is larger than 4 microns. Such defects of metal contact layer in semiconductor devices not only lead to low throughput of manufacturing process, but also cause device performance deterioration and long term reliability concerns, especially for power management devices, where the high power handling capability often requires aluminum metal contact layer up to 7 microns. Unfortunately current state-of-art technologies do not have the capability of producing whiskers free thick aluminum films while maintaining high throughput. It is therefore a need to develop new metal compositions and processes to form thick metal contact layers for power semiconductor devices that are comparable to the characteristics of thick aluminum layers.

SUMMARY OF THE INVENTION

The present invention discloses a semiconductor device comprising a substrate layer, an epitaxial layer, a dielectric layer, a first aluminum layer, a first titanium interlayer and a second aluminum layer. The first titanium interlayer is disposed between the first aluminum layer and the second aluminum layer.

A process for fabricating a semiconductor device is disclosed. A semiconductor wafer is provided. A first aluminum layer is deposited onto the semiconductor wafer. A first titanium interlayer is deposited onto the first aluminum layer. A second aluminum layer is deposited onto the first titanium interlayer. An etching process is applied so that a plurality of trenches are formed so as to expose a plurality of top surfaces of a dielectric layer. A singulation process is applied so as to form a plurality of separated semiconductor devices.

DETAILED DESCRIPTION OF THE INVENTION

Figure 1:
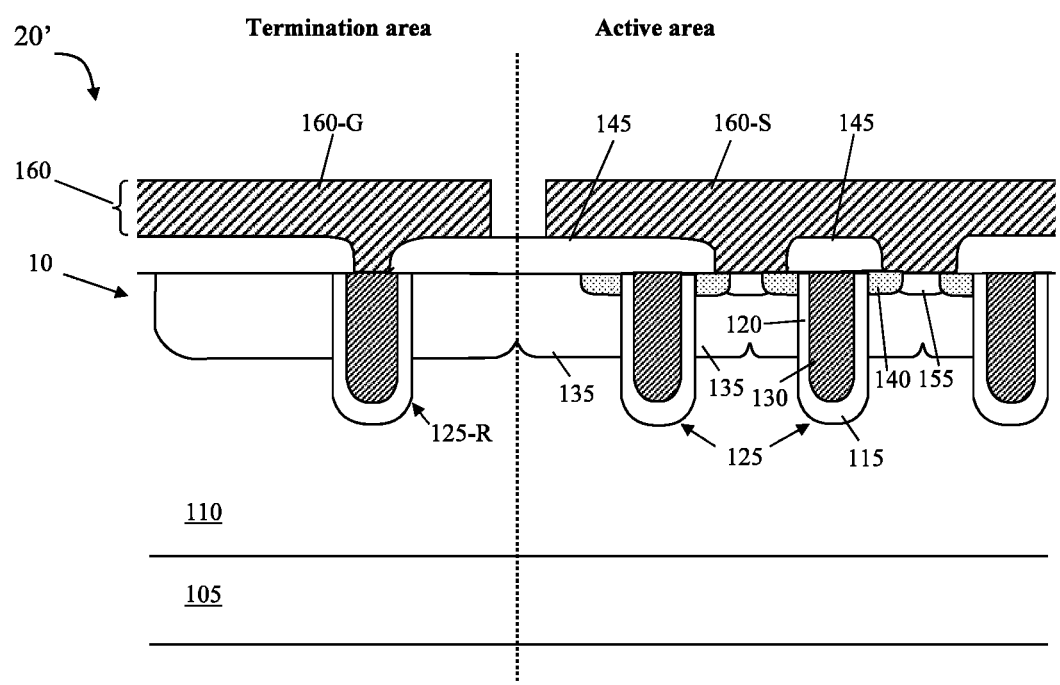
FIG. 1 is a cross sectional view of a portion of a semiconductor device of a top contact metal layer up to 7 microns.

FIG. 1 is a cross sectional view of a portion of a semiconductor device 20'. The semiconductor device 20' is a power transistor such as metal-oxide-semiconductor field-effect transistor (MOSFET) chip. In a fabrication process, a thick aluminum metal layer 160 is deposited on top of a semiconductor wafer 10. The thick aluminum metal layer 160 has a thickness of up to 7 microns or more and is separated into a gate metal 160-G in a termination area and a source metal 160-S in an active area. The active area has a plurality of transistor cells formed on the semiconductor wafer each may include a trench 125 filed with insulated gate material 130 extending into an epitaxial layer 110 overlaying a substrate layer 105 that functions as a drain. The insulated gate may have a thicker insulation region 115 in bottom portions of the plurality of trenches 125. Alternatively, the insulation region 115 may have substantially a same thickness as a gate insulation layer 120 on sidewalls of the plurality of trenches 125. The epitaxial layer 110 comprises body regions 135, source regions 140 and body contact implant regions 155. A dielectric layer 145 overlays a portion of a top surface of the epitaxial layer 110. The plurality of trenches 125 may be gate trenches. A gate runner trench 125-R in the termination area may be wider and deeper than the plurality of gate trenches 125. Alternatively, the semiconductor device 20' may be an Insulated Gate Bipolar Transistor (IGBT) or other type of power transistors.

Figure 2:
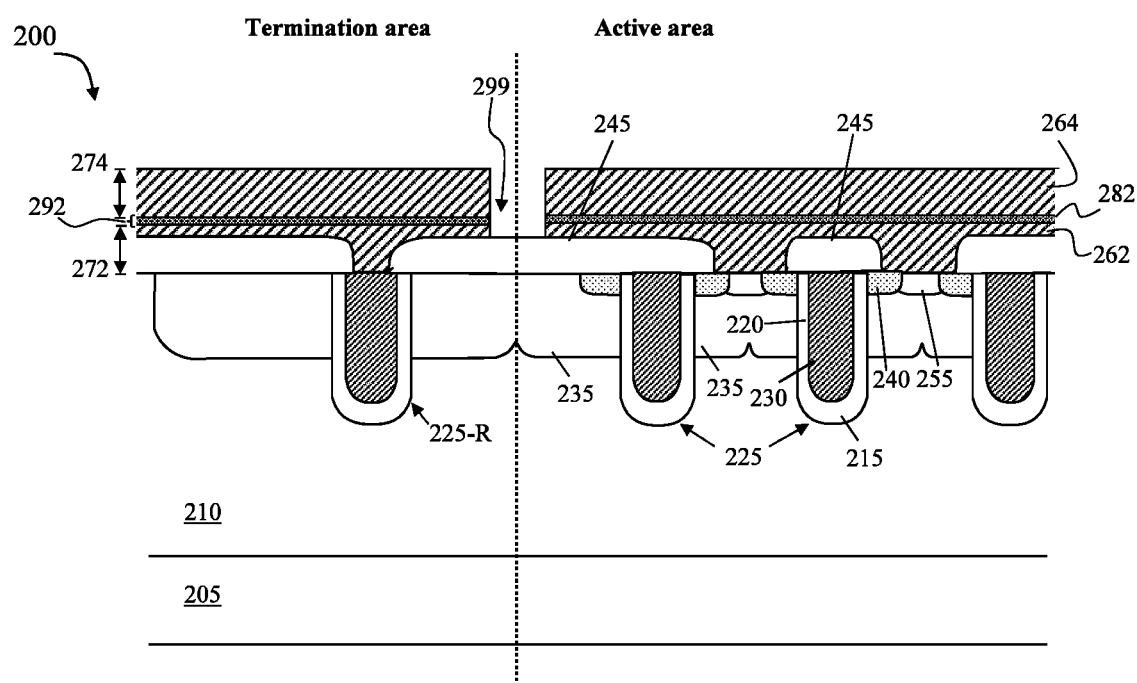
FIG. 2 is a cross sectional view of a portion of a semiconductor device in examples of the present disclosure.

FIG. 2 is a cross sectional view of a portion of a semiconductor device 200 in examples of the present disclosure. The semiconductor device 200 comprises a heavily N type doped silicon substrate layer 205, a lightly N type doped silicon epitaxial layer 210, a dielectric layer 245, a first aluminum layer 262, a first titanium interlayer 282 and a second aluminum layer 264. A bottom surface of the epitaxial layer 210 is directly attached to a top surface of the substrate layer 205. A bottom surface of the dielectric layer 245 is directly attached to a top surface of the epitaxial layer 210. The first aluminum layer 262 is directly attached to the dielectric layer 245. A bottom surface of the first titanium interlayer 282 is directly attached to a top surface of the first aluminum layer 262. A bottom surface of the second aluminum layer 264 is directly attached to a top surface of the first titanium interlayer 282. The first titanium interlayer 282 is disposed between the first aluminum layer 262 and the second aluminum layer 264. In examples of the present disclosure, heavily doped has ion concentration in a range above $10^{18}$ cm$^{-3}$. Doped has ion concentration in a range from $10^{16}$ to $10^{18}$ cm$^{-3}$. Lightly doped has ion concentration in a range below $10^{16}$ cm$^{-3}$.

In examples of the present disclosure, the epitaxial layer 210 comprises P type doped body regions 235, heavily N type doped source regions 240, heavily P type doped body contact implant regions 255, a plurality of gate trenches 225 in an active area and a gate runner trench 225-R in a termination area. The plurality of gate trenches 225 are filed with a same insulated gate material 230. The insulation region 215 at bottom portion of trenches may be thicker or may have substantially a same thickness as a gate insulation layer 220 on sidewalls of the plurality of gate trenches 225.

In examples of the present disclosure, the first aluminum layer 262 directly contacts the source regions 240. The epitaxial layer 210 is made of a silicon material. A separation trench 299 formed by an etching process divides the first aluminum layer 262, the first titanium interlayer 282 and the second aluminum layer 264 into a first portion in the termination area and a second portion in the active area.

In examples of the present disclosure, a thickness 272 of the first aluminum layer 262 and a thickness 274 of the second aluminum layer 264 are in a range from 1 micron to 4 microns. Scanning electron microscope (SEM) images show that lateral extrusion including whiskers and hillocks of an aluminum layer significantly increases when a thickness of the aluminum layer is larger than 4 microns. A thickness of an aluminum layer less than 1 micron may not provide sufficient mechanical support.

In examples of the present disclosure, a thickness 292 of the first titanium interlayer 282 is in a range from 10 angstroms to 500 angstroms. Titanium is harder than aluminum. In examples of the present disclosure, titanium aluminide (TiAl, Ti3Al or TiAl3) is formed at the interfaces between a titanium interlayer and an aluminum layer. A titanium interlayer mitigates the growth of lateral extrusion of adjacent aluminum layers. A thickness of a titanium interlayer in the range from 10 angstroms to 500 angstroms does not significantly reduce a conductivity nor significantly increase a resistance of aluminum-titanium-aluminum composite.

In examples of the present disclosure, a thickness 292 of the first titanium interlayer 282 is in a range from 90 angstroms to 110 angstroms (100 angstroms +/− a variation of 10 angstroms). A control of the uniformity of a thickness of the titanium interlayer becomes challenging when the thickness of the titanium interlayer is less than 100 angstroms. A thinner titanium interlayer has less impact on the resistance than a thicker titanium interlayer.

Figure 3:
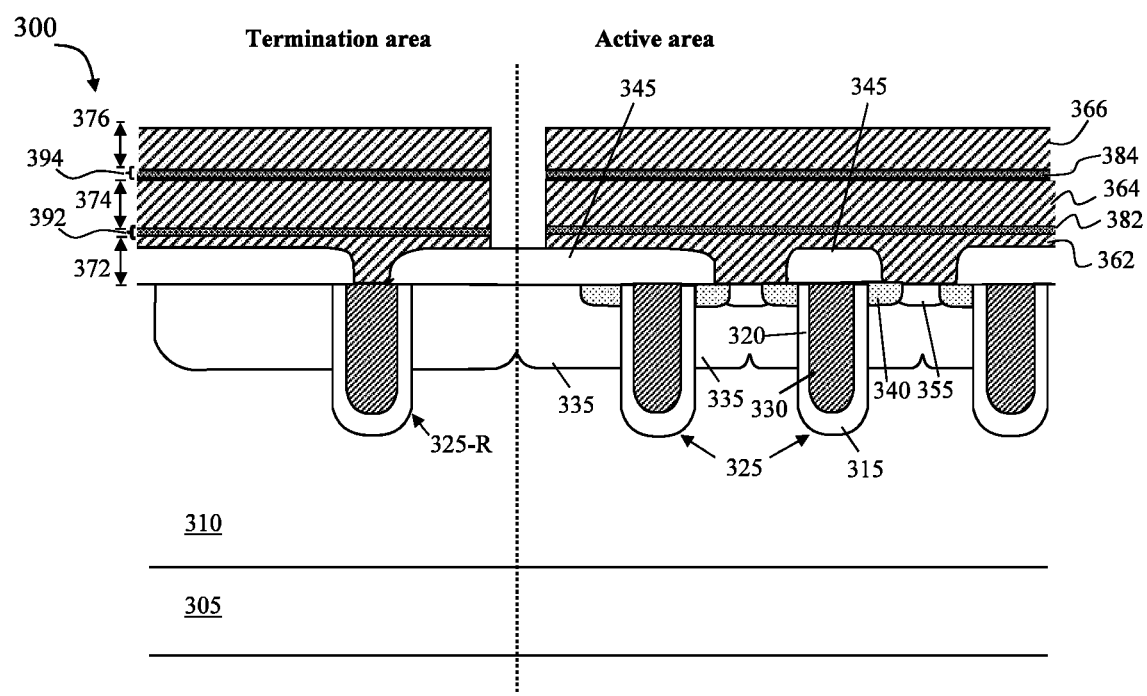
FIG. 3 is a cross sectional view of a portion of another semiconductor device in examples of the present disclosure.

FIG. 3 is a cross sectional view of a portion of a semiconductor device 300 in examples of the present disclosure. The semiconductor device 300 comprises a heavily N type doped silicon substrate layer 305, a lightly N type doped silicon epitaxial layer 310, a dielectric layer 345, a first aluminum layer 362, a first titanium interlayer 382, a second aluminum layer 364, a second titanium interlayer 384 and a third aluminum layer 366. A bottom surface of the epitaxial layer 310 is directly attached to a top surface of the substrate layer 305. A bottom surface of the dielectric layer 345 is directly attached to a top surface of the epitaxial layer 310. The first aluminum layer 362 is directly attached to the dielectric layer 345. A bottom surface of the first titanium interlayer 382 is directly attached to a top surface of the first aluminum layer 362. A bottom surface of the second aluminum layer 364 is directly attached to a top surface of the first titanium interlayer 382. The first titanium interlayer 382 is disposed between the first aluminum layer 362 and the second aluminum layer 364. A bottom surface of the second titanium interlayer 384 is directly attached to a top surface of the second aluminum layer 364. A bottom surface of the third aluminum layer 366 is directly attached to a top surface of the second titanium interlayer 384. The second titanium interlayer 384 is disposed between the second aluminum layer 364 and the third aluminum layer 366.

In examples of the present disclosure, the epitaxial layer 310 comprises P type doped body regions 335, heavily N type doped source regions 340, heavily P type doped body contact implant regions 355, a plurality of gate trenches 325 in an active area and a gate runner trench 325-R in a termination area. The plurality of gate trenches 325 are filed with a same insulated gate material 330. The insulation region 315 at bottom portion of trenches may be thicker or may have substantially a same thickness as a gate insulation layer 320 on sidewalls of the plurality of gate trenches 325.

In examples of the present disclosure, a thickness 372 of the first aluminum layer 362, a thickness 374 of the second aluminum layer 364 and a thickness 376 of the third aluminum layer 366 are in a range from 1 micron to 4 microns. In examples of the present disclosure, a thickness 392 of the first titanium interlayer 382 and a thickness 394 of the second titanium interlayer 384 are in a range from 10 angstroms to 500 angstroms. In examples of the present disclosure, a thickness 392 of the first titanium interlayer 382 and a thickness 394 of the second titanium interlayer 384 are in a range from 90 angstroms to 110 angstroms (100 angstroms +/− a variation of 10 angstroms).

Figure 4:
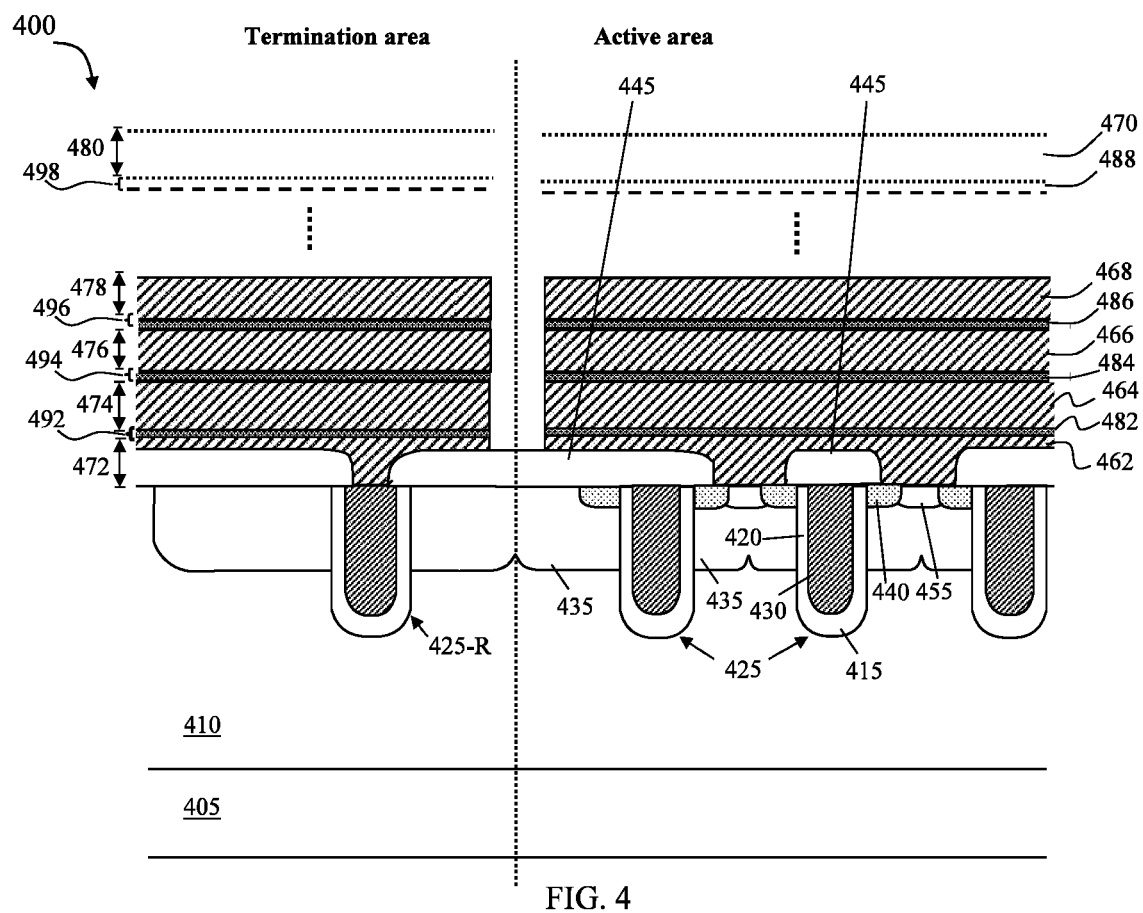
FIG. 4 is a cross sectional view of a portion of still another semiconductor device in examples of the present disclosure.

FIG. 4 is a cross sectional view of a portion of a semiconductor device 400 in examples of the present disclosure. The semiconductor device 400 comprises a heavily N type doped silicon substrate layer 405, a lightly N type doped silicon epitaxial layer 410, a dielectric layer 445, a first aluminum layer 462, a first titanium interlayer 482, a second aluminum layer 464, a second titanium interlayer 484, a third aluminum layer 466, a third titanium interlayer 486 and a fourth aluminum layer 468. A bottom surface of the epitaxial layer 410 is directly attached to a top surface of the substrate layer 405. A bottom surface of the dielectric layer 445 is directly attached to a top surface of the epitaxial layer 410. The first aluminum layer 462 is directly attached to the dielectric layer 445. A bottom surface of the first titanium interlayer 482 is directly attached to a top surface of the first aluminum layer 462. A bottom surface of the second aluminum layer 464 is directly attached to a top surface of the first titanium interlayer 482. The first titanium interlayer 482 is disposed between the first aluminum layer 462 and the second aluminum layer 464. A bottom surface of the second titanium interlayer 484 is directly attached to a top surface of the second aluminum layer 464. A bottom surface of the third aluminum layer 466 is directly attached to a top surface of the second titanium interlayer 484. The second titanium interlayer 484 is disposed between the second aluminum layer 464 and the third aluminum layer 466. A bottom surface of the third titanium interlayer 486 is directly attached to a top surface of the third aluminum layer 466. A bottom surface of the fourth aluminum layer 468 is directly attached to a top surface of the third titanium interlayer 486. The third titanium interlayer 486 is disposed between the third aluminum layer 466 and the fourth aluminum layer 468.

In examples of the present disclosure, the epitaxial layer 410 comprises P type doped body regions 435, heavily N type doped source regions 440, heavily P type doped body contact implant regions 455, a plurality of gate trenches 425 in an active area and a gate runner trench 425-R in a termination area. The plurality of gate trenches 425 are filed with a same insulated gate material 430. The insulation region 415 at bottom portion of trenches may be thicker or may have substantially a same thickness as a gate insulation layer 420 on sidewalls of the plurality of gate trenches 425.

In examples of the present disclosure, a thickness 472 of the first aluminum layer 462, a thickness 474 of the second aluminum layer 464, a thickness 476 of the third aluminum layer 466 and a thickness 478 of the fourth aluminum layer 468 are in a range from 1 micron to 4 microns. In examples of the present disclosure, a thickness 492 of the first titanium interlayer 482, a thickness 494 of the second titanium interlayer 484 and a thickness 496 of the third titanium interlayer 486 are in a range from 10 angstroms to 500 angstroms. In examples of the present disclosure, a thickness 492 of the first titanium interlayer 482, a thickness 494 of the second titanium interlayer 484 and a thickness 496 of the third titanium interlayer 486 are in a range from 90 angstroms to 110 angstroms (100 angstroms +/− a variation of 10 angstroms).

In examples of the present disclosure, a plurality of optional (shown in dashed lines) titanium interlayers 488 and a plurality of optional (shown in dashed lines) aluminum layers 470 are deposited above the fourth aluminum layer 468. Each of the plurality of optional titanium interlayers 488 is sandwiched between a respective top aluminum layer and a respective bottom layer of the plurality of optional aluminum layers 470.

In examples of the present disclosure, a thickness 480 of each of the plurality of optional aluminum layers 470 is in a range from 1 micron to 4 microns. In examples of the present disclosure, a thickness 498 of each of the plurality of optional titanium interlayers 488 is in a range from 10 angstroms to 500 angstroms. In examples of the present disclosure, a thickness 498 of each of the plurality of optional titanium interlayers 488 is in a range from 90 angstroms to 110 angstroms (100 angstroms +/− a variation of 10 angstroms).

Figure 5:
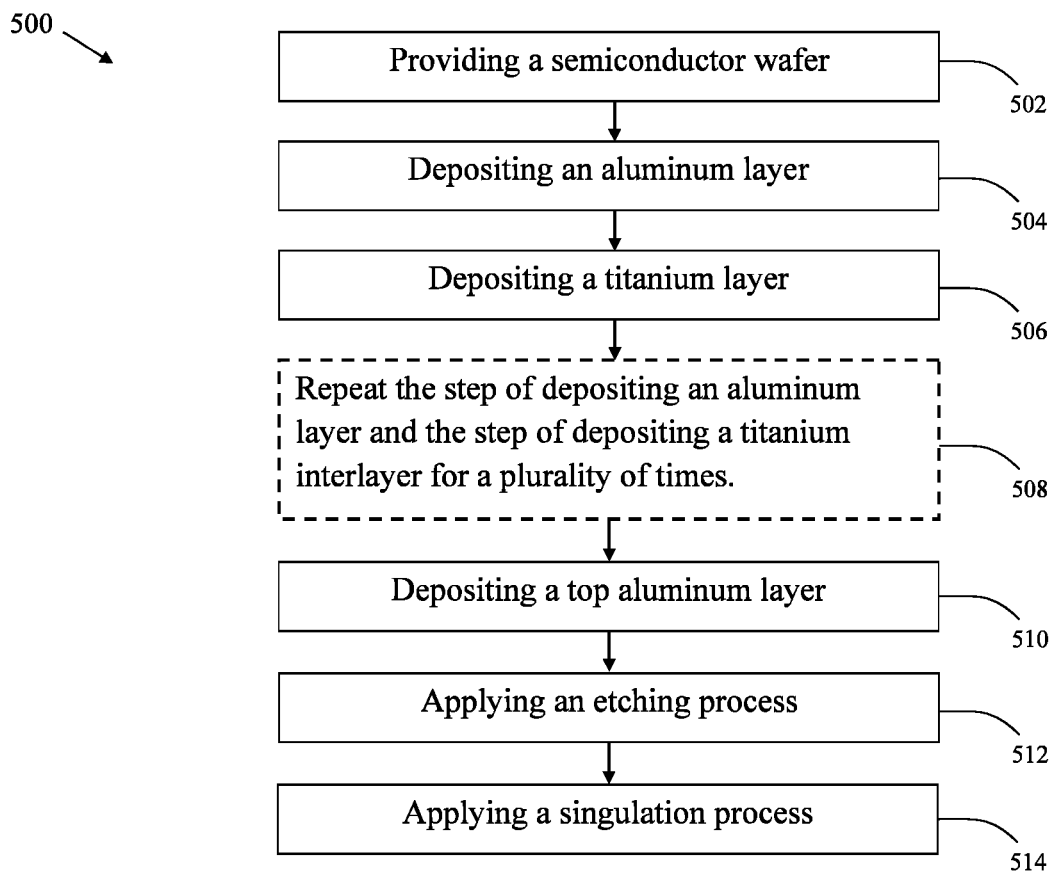
FIG. 5 is a flowchart of a process to fabricate a semiconductor device in examples of the present disclosure.

FIG. 5 is a flowchart of a process 500 to fabricate a semiconductor device in examples of the present disclosure. The process 500 may begin in block 502.

Figure 6:
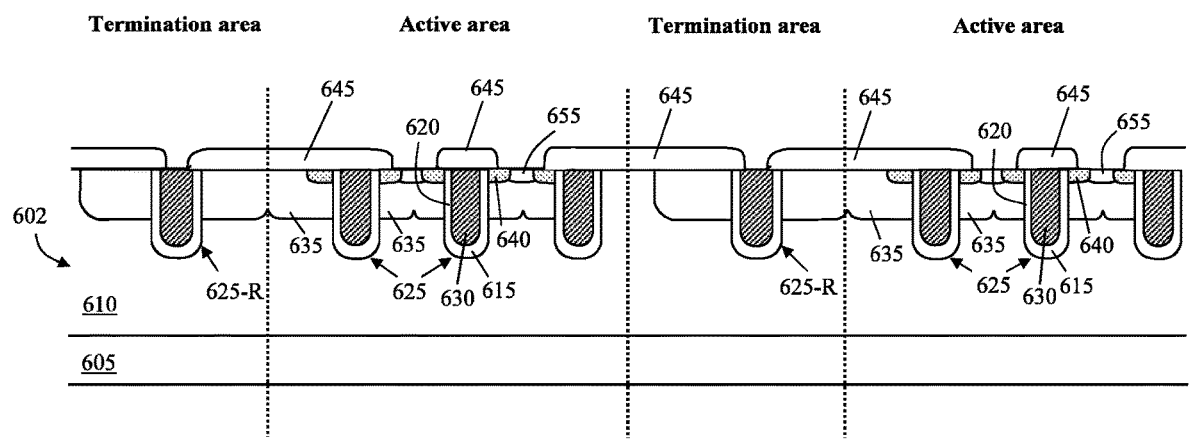
FIG. 6, FIG. 7, FIG. 8, FIG. 9, FIG. 10 and FIG. 11 show cross sectional views of steps of the process to fabricate the semiconductor device of FIG. 5 in examples of the present disclosure.

In block 502, a semiconductor wafer 602 of FIG. 6 is provided. The semiconductor wafer 602 comprises a heavily N type doped silicon substrate layer 605, a lightly N type doped silicon epitaxial layer 610 and a dielectric layer 645. A bottom surface of the epitaxial layer 610 is directly attached to a top surface of the substrate layer 605. A bottom surface of the dielectric layer 645 is directly attached to a top surface of the epitaxial layer 610. The epitaxial layer 610 comprises P type doped body regions 635, heavily N type doped source regions 640, heavily P type doped body contact implant regions 655, a plurality of gate trenches 625 in active areas and gate runner trenchs 625-R in termination areas. The plurality of gate trenches 625 are filed with a same insulated gate material 630. The insulation region 615 at bottom portion of trenches may be thicker or may have substantially a same thickness as a gate insulation layer 620 on sidewalls of the plurality of gate trenches 625. Block 502 may be followed by block 504.

Figure 7:
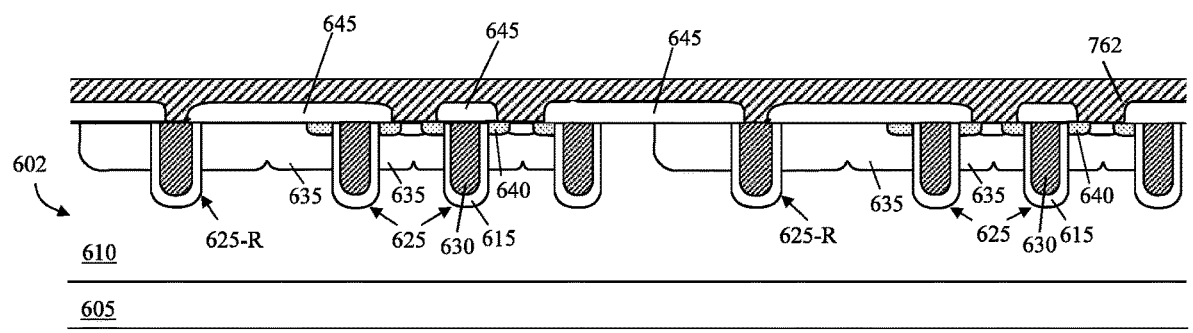

In block 504, an aluminum layer 762 of FIG. 7 is deposited onto the semiconductor wafer 602. In one example, the aluminum layer 762 of FIG. 7 is deposited onto the semiconductor wafer 602 at a first predetermined temperature in a range from 350° C. to 500° C. The aluminum layer 762 directly contacts the dielectric layer 645. The aluminum layer 762 directly contacts the epitaxial layer 610. Block 504 may be followed by block 506.

Figure 8:
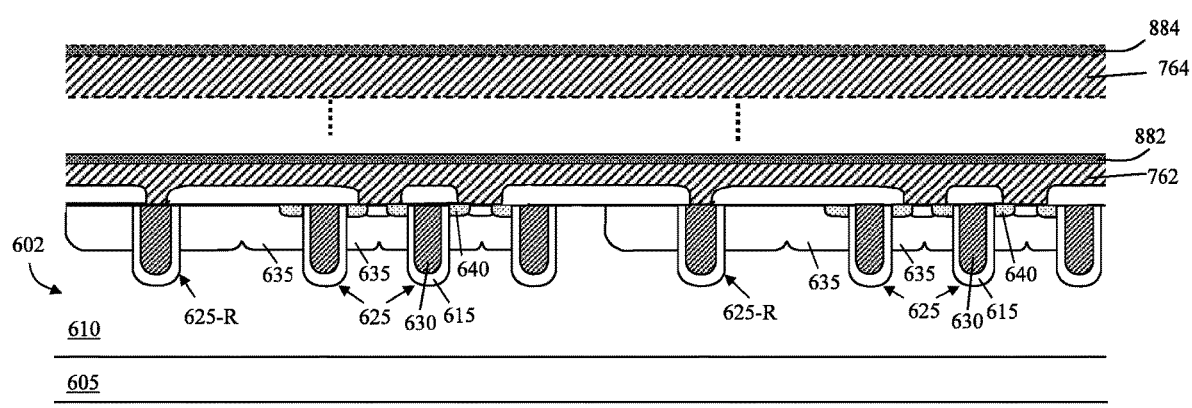

In block 506, a titanium interlayer 882 of FIG. 8 is deposited onto the aluminum layer 762. In one example, the titanium interlayer 882 of FIG. 8 is deposited onto the aluminum layer 762 at a second predetermined temperature in a range from 100° C. to 200° C. A bottom surface of the titanium interlayer 882 is directly attached to a top surface of the aluminum layer 762. In examples of the present disclosure, a thickness of the titanium interlayer 882 is smaller than one-tenth of a thickness of the aluminum layer 762. Block 506 may be followed by block 508.

In block 508, the step of depositing an aluminum layer followed by the step of depositing a titanium interlayer are optionally (shown in dashed lines) repeated for a plurality of times. A plurality of optional (shown in dashed lines) titanium interlayers 884 of FIG. 8 and a plurality of optional (shown in dashed lines) aluminum layers 764 are deposited above the titanium interlayer 882. In one example, the plurality of optional (shown in dashed lines) titanium interlayers 884 of FIG. 8 are deposited at a third predetermined temperature, a fifth predetermined temperature, Et cetera, in the range from 350° C. to 500° C. The plurality of optional (shown in dashed lines) aluminum layers 764 are deposited at a fourth predetermined temperature, sixth predetermined temperature, Et cetera, in the range from 100° C. to 200° C. Each of the plurality of optional titanium interlayers 884 is sandwiched between a respective top aluminum layer and a respective bottom layer of the plurality of optional aluminum layers 764. Block 508 may be followed by block 510.

Figure 9:
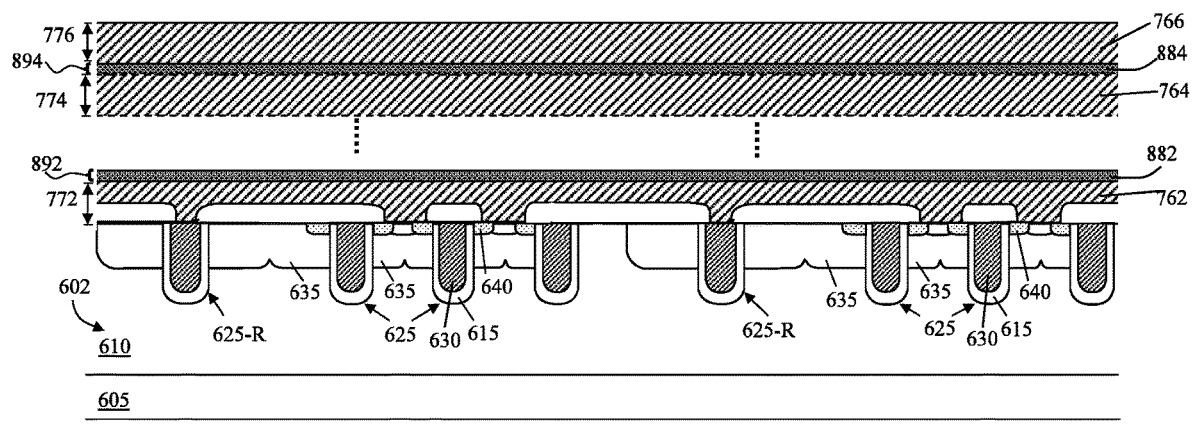

In block 510, a top aluminum layer 766 of FIG. 9 is deposited onto the titanium interlayer 882 (without the plurality of optional titanium interlayers 884 and the plurality of optional aluminum layers 764) or onto an exposed titanium interlayer of the plurality of optional titanium interlayers 884 (with the plurality of optional titanium interlayers 884 and the plurality of optional aluminum layers 764). In examples of the present disclosure, a thickness 772 of the aluminum layer 762, a thickness 774 of each of the optional aluminum layers 764 and a thickness 776 of the aluminum layer 766 are in a range from 1 micron to 4 microns. In examples of the present disclosure, a thickness 892 of the titanium interlayer 882 and a thickness 894 of each of the plurality of optional titanium interlayers 884 are in a range from 10 angstroms to 500 angstroms. In examples of the present disclosure, a thickness 892 of the titanium interlayer 882 and a thickness 894 of each of the plurality of optional titanium interlayers 884 are in a range from 90 angstroms to 110 angstroms (100 angstroms +/− a variation of 10 angstroms). Block 510 may be followed by block 512.

Figure 10:
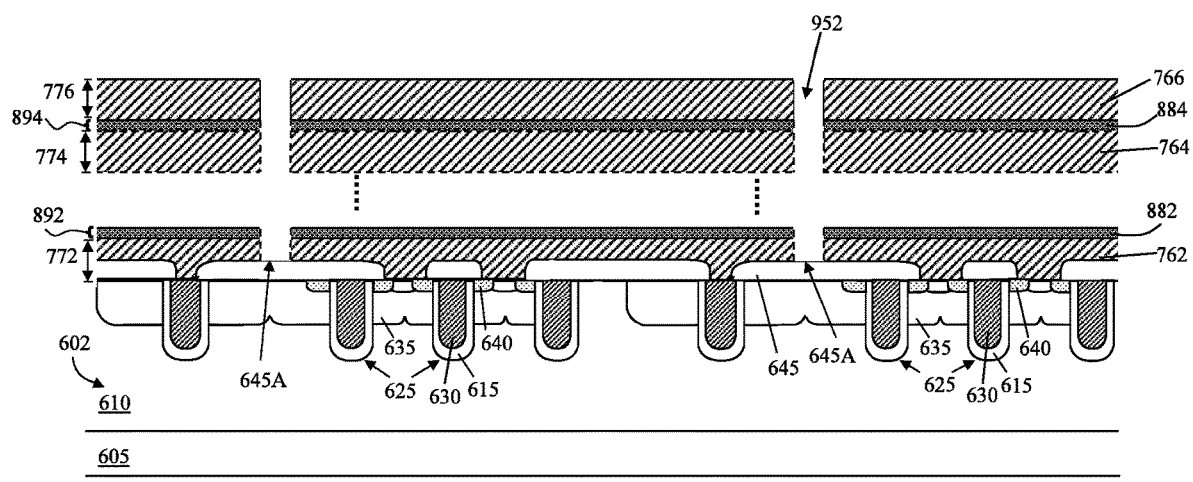

In block 512, an etching process is applied. A plurality of trenches 952 of FIG. 10 are formed so as to expose a plurality of top surfaces 645A of the dielectric layer 645. Block 512 may be followed by block 514.

Figure 11:
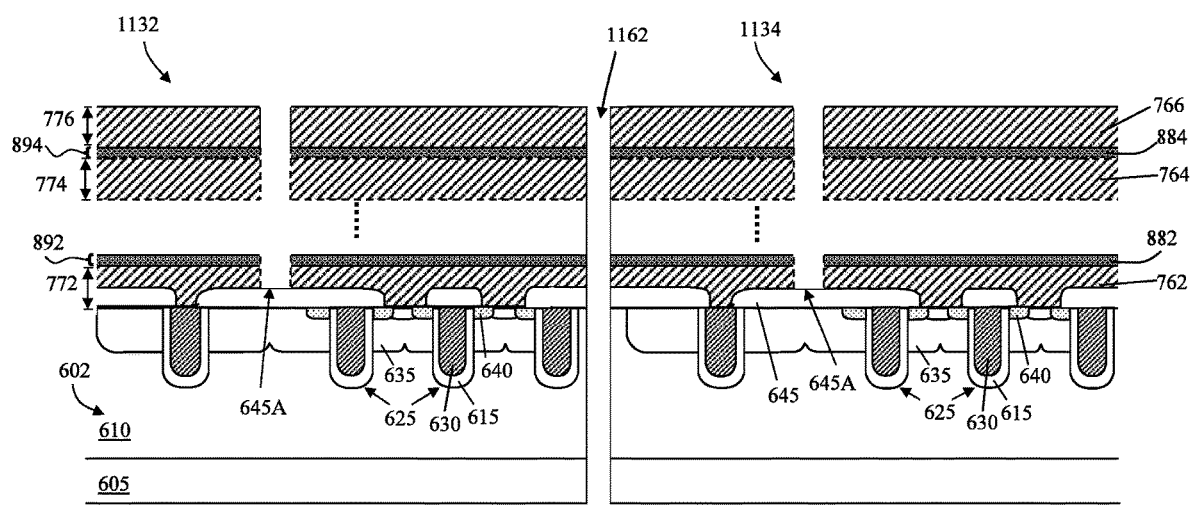

In block 514, a singulation process is applied. A cut 1162 of FIG. 11 along a scribe line separating a semiconductor device 1132 and a semiconductor device 1134. Though only two semiconductor devices are shown in FIG. 11, a total number of semiconductor devices in a wafer may vary.

Those of ordinary skill in the art may recognize that modifications of the embodiments disclosed herein are possible. For example, a total number of the termination areas and a total number of the active areas of the semiconductor wafer 602 of FIG. 6 may vary. Other modifications may occur to those of ordinary skill in this art, and all such modifications are deemed to fall within the purview of the present invention, as defined by the claims.

The invention claimed is:

1. A method for fabricating semiconductor devices, the method comprising the steps of:
   providing a semiconductor wafer comprising
      a substrate layer, the substrate layer being a heavily doped first conductivity type silicon substrate layer;
      an epitaxial layer directly attached to the substrate layer, the epitaxial layer being a lightly doped first conductivity type silicon epitaxial layer;

a dielectric layer directly attached to the epitaxial layer;
depositing a first aluminum layer on the semiconductor wafer at a first predetermined temperature in a range from 350° C. to 500° C.;
depositing a first titanium interlayer on the first aluminum layer at a second predetermined temperature in a range from 100° C. to 200° C.;
depositing a second aluminum layer on the first titanium interlayer at a third predetermined temperature in the range from 350° C. to 500° C.;
applying an etching process to expose a portion of the dielectric layer; and
applying a singulation process forming a plurality of separated semiconductor devices;
wherein a thickness of the first titanium interlayer is in a range from ten angstroms to five hundred angstroms; and
wherein a thickness of the first aluminum layer and a thickness of the second aluminum layer are in a range from one micron to four microns.

2. The method of claim 1, the thickness of the first titanium interlayer is in a range from ninety angstroms to one hundred and ten angstroms.

3. The method of claim 1, after the step of depositing the second aluminum layer,
depositing a second titanium interlayer on the second aluminum layer at a fourth predetermined temperature in the range from 100° C. to 200° C.; and
depositing a third aluminum layer on the second titanium interlayer at a fifth predetermined temperature in the range from 350° C. to 500° C.

4. The method of claim 3, after the step of depositing the third aluminum layer,
depositing a third titanium interlayer on the third aluminum layer at a sixth predetermined temperature in the range from 100° C. to 200° C.; and
depositing a fourth aluminum layer on the third titanium interlayer at a seventh predetermined temperature in the range from 350° C. to 500° C.

5. The method of claim 4, wherein the thickness of the first titanium interlayer, a thickness of the second titanium interlayer and a thickness of the third titanium interlayer are in a range from ninety angstroms to one hundred and ten angstroms.

6. The method of claim 5, wherein the thickness of the first aluminum layer, the thickness of the second aluminum layer, a thickness of the third aluminum layer and a thickness of the fourth aluminum layer are in a range from one micron to four microns.

7. The method of claim 6, wherein the etching process etches through the first aluminum layer, the first titanium interlayer, the second aluminum layer, the second titanium interlayer, the third aluminum layer, the third titanium interlayer and the fourth aluminum layer.

8. The method of claim 1,
wherein the substrate layer has ion concentration in a range above $10^{18}$ cm$^{-3}$; and
wherein the epitaxial layer has ion concentration in a range below $10^{16}$ cm$^{-3}$.

9. A method for fabricating semiconductor devices, the method comprising the steps of:
providing a semiconductor wafer comprising
a substrate layer, the substrate layer being a heavily doped first conductivity type silicon substrate layer;
an epitaxial layer directly attached to the substrate layer, the epitaxial layer being a lightly doped first conductivity type silicon epitaxial layer;
a dielectric layer directly attached to the epitaxial layer;
depositing a first aluminum layer on the semiconductor wafer at a first predetermined temperature in a range from 350° C. to 500° C.;
depositing a first titanium interlayer on the first aluminum layer at a second predetermined temperature in a range from 100° C. to 200° C.;
depositing a second aluminum layer on the first titanium interlayer at a third predetermined temperature in the range from 350° C. to 500° C.;
applying an etching process to expose a portion of the dielectric layer; and
applying a singulation process forming a plurality of separated semiconductor devices;
wherein the epitaxial layer comprises
a plurality of source regions; and
a plurality of trenches filled with a same insulated gate material;
wherein the first aluminum layer directly contacts the plurality of source regions;
wherein the epitaxial layer is made of a silicon material; and
wherein a separation trench formed by the etching process divides the first aluminum layer, the first titanium interlayer and the second aluminum layer into a first portion in a termination area and a second portion in an active area.

10. A method for fabricating semiconductor devices, the method comprising the steps of:
providing a semiconductor wafer comprising
a substrate layer, the substrate layer being a heavily doped first conductivity type silicon substrate layer;
an epitaxial layer directly attached to the substrate layer, the epitaxial layer being a lightly doped first conductivity type silicon epitaxial layer;
a dielectric layer directly attached to the epitaxial layer;
depositing a first aluminum layer on the semiconductor wafer;
depositing a first titanium interlayer on the first aluminum layer;
depositing a second aluminum layer on the first titanium interlayer;
applying an etching process to expose a portion of the dielectric layer; and
applying a singulation process forming a plurality of separated semiconductor devices;
wherein a thickness of the first titanium interlayer is in a range from ten angstroms to five hundred angstroms; and
wherein a thickness of the first aluminum layer and a thickness of the second aluminum layer are in a range from one micron to four microns.

11. The method of claim 10, after the step of depositing the second aluminum layer,
depositing a second titanium interlayer on the second aluminum layer; and
depositing a third aluminum layer on the second titanium interlayer.

12. The method of claim 11, after the step of depositing the third aluminum layer,
depositing a third titanium interlayer on the third aluminum layer; and
depositing a fourth aluminum layer on the third titanium interlayer.

13. The method of claim 10,
wherein the substrate layer has ion concentration in a range above $10^{18}$ cm$^{-3}$; and wherein the epitaxial layer has ion concentration in a range below $10^{16}$ cm$^{-3}$.

* * * * *